(12) United States Patent
Spangberg

(10) Patent No.: US 9,338,911 B2
(45) Date of Patent: May 10, 2016

(54) ELECTRONIC ENCLOSURE DEVICE

(71) Applicant: Valeo Powertrain Energy Conversion AS, Drammen (NO)

(72) Inventor: Erik Spangberg, Drammen (NO)

(73) Assignee: Valeo Powertrain Energy Conversion AS, Drammen (NO)

( * ) Notice: Subject to any disclaimer, the term of this patent is extended or adjusted under 35 U.S.C. 154(b) by 54 days.

(21) Appl. No.: 14/505,594

(22) Filed: Oct. 3, 2014

(65) Prior Publication Data

US 2015/0098200 A1    Apr. 9, 2015

(30) Foreign Application Priority Data

Oct. 3, 2013 (GB) .................................... 1317535.1

(51) Int. Cl.
*H05K 1/18* (2006.01)
*H05K 5/06* (2006.01)
*H05K 7/14* (2006.01)

(52) U.S. Cl.
CPC ................ *H05K 5/069* (2013.01); *H05K 5/061* (2013.01); *H05K 7/1427* (2013.01)

(58) Field of Classification Search
USPC .................... 361/764, 752, 761, 718
See application file for complete search history.

(56) References Cited

U.S. PATENT DOCUMENTS

| 5,814,765 A | 9/1998 | Bauer et al. | |
| 2004/0240191 A1* | 12/2004 | Arnold | H01L 23/04 361/800 |
| 2012/0134121 A1* | 5/2012 | Kanemoto | B81C 1/00801 361/748 |

FOREIGN PATENT DOCUMENTS

EP    2654271 A1    10/2013

OTHER PUBLICATIONS

Combined Search and Examination Report issued in corresponding GB Patent Application No. 1317535.1, mailed on Mar. 10, 2014 (6 pages).

* cited by examiner

*Primary Examiner* — Andargie M Aychillhum
(74) *Attorney, Agent, or Firm* — Osha • Liang LLP

(57) ABSTRACT

An electronic enclosure device including an enclosure, an electric circuit device, and a sealing device is disclosed. The sealing device is provided as one, continuous gasket having a first gasket section configured to seal a first sealing area, a second gasket section configured to seal the second sealing area, and a third gasket section configured to seal the third sealing area.

12 Claims, 7 Drawing Sheets

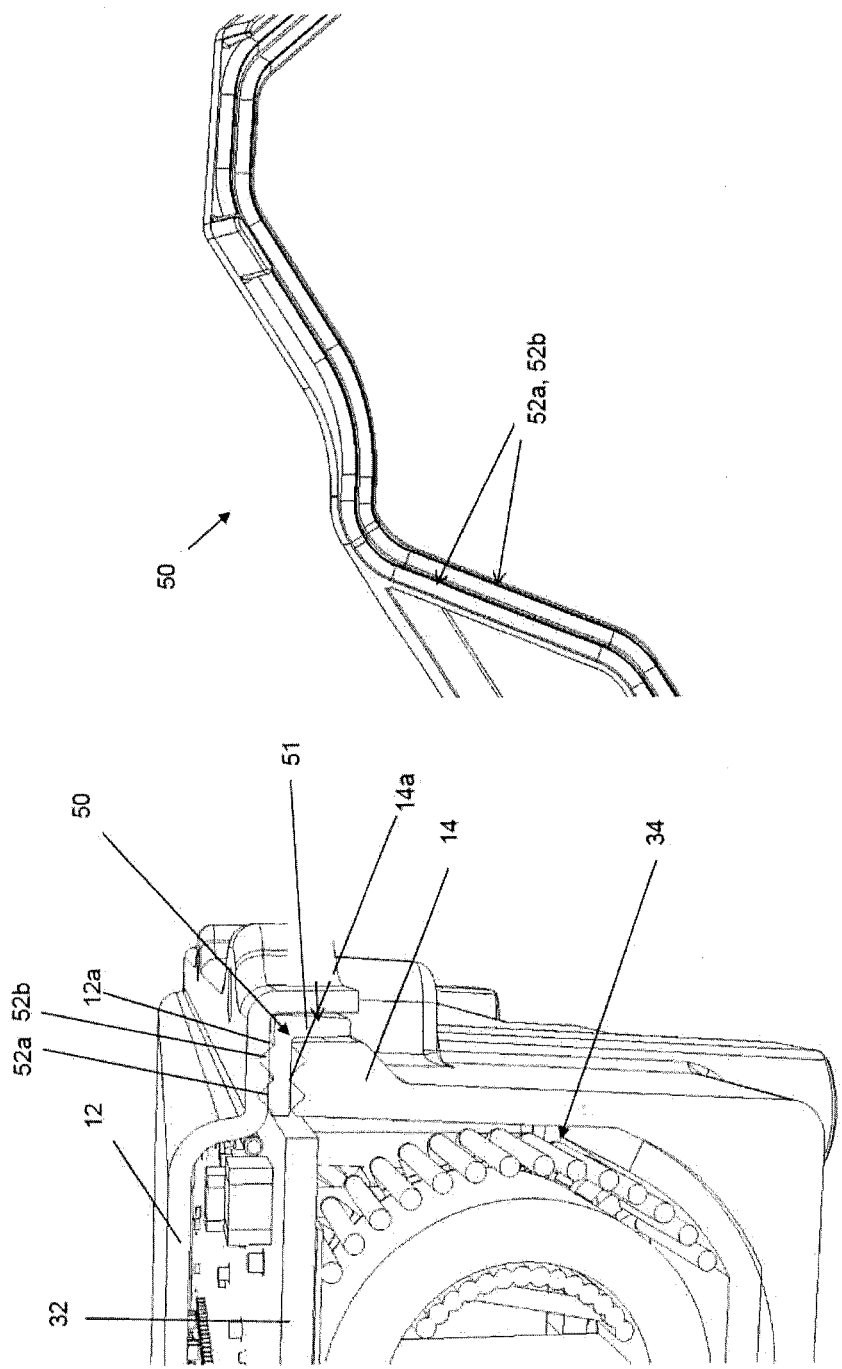

ELECTRONIC ENCLOSURE DEVICE

FIELD OF THE INVENTION

The present invention relates to an electronic enclosure device.

TECHNICAL BACKGROUND

It is known to provide electronic equipment inside an enclosure in order to protect the electronic equipment from the environment and its mechanically and electrically negative effects, such as pollution from gasses, fluids and particles. The electronic equipment typically comprises a printed circuit board (PCB) with electronic components. Such an enclosure typically comprises first and second sections, typically a compartment section and a lid section, where a first sealing area is formed by the area where the compartment section and the lid section is meeting each other.

One or more electrical conductors are penetrating the enclosure to connect the electronic equipment inside the enclosure to electronic equipment outside the enclosure.

The transition between the different sections of the enclosure and the electrical conductors penetrating the enclosure needs to be sealed in order to prevent pollution from the outside environment into the enclosure. One known solution is to use glue to seal the transition of the different components.

The disadvantage of using glue is that it is not possible to disassemble the enclosure and electronic equipment from each other again. There will also be variations to the amount and distribution of the glue in the production process. With a design where the sealing needs to be a continuous sealing for both the electrical conductors and the enclosure sections, the assembly process of gluing has to be done in two steps. First the electrical conductors need to be glued to the enclosure. Then the lid section needs to be glued to both the conductors and the compartment section. The glue in the first assembly step will start curing before the glue is applied in the second assembly step. In the transition area where the two sealing loops meet each other the glue in the second assembly step needs to bond with the cured glue from the first assembly step and make a continues sealing. Often, the transition area has a weak bonding, since pores are likely to occur in this area. Moreover, hardened glue from the first assembly step may prevent a proper sealing of the lid section and the compartment section during the second assembly step.

In the case of using gaskets to seal between the components there is a challenge when both the enclosure parts and the electrical conductor's needs to be sealed with one continuous sealing solution. Using several gaskets for instance will cause unwanted transitions. The direction of the pressure applied to the gasket is also relevant to such a design. In many cases the assembly process requires a certain direction of movement in order to make the parts come correctly together.

The object of the invention is to provide an electronic enclosure device using a sealing solution optimized for an easy, fast and reliable assembly process and also the possibility to disassemble the product without damaging the components.

Another object is to ensure that the electronic enclosure device is enclosing the electronic equipment in a sufficient way during the entire lifetime of the electronic equipment. The expected lifetime for some types of electronic equipment, for example for electric vehicles, may be up to 15 years.

Yet another object is to achieve that the electronic equipment enclosed in the electronic enclosure device is correctly aligned with other equipment within the enclosure, i.e. that there should be no risk of the electronic equipment being moved during or after the above-mentioned assembly steps.

SUMMARY OF THE INVENTION

The present invention relates to an electronic enclosure device, comprising:
- a enclosure comprising a first enclosure section and a second enclosure section, where a compartment is provided inside the enclosure and where an opening is provided in the enclosure into the compartment;
- an electric circuit device comprising a printed circuit board, electronic components connected to the printed circuit board and an electrical connector connected to the printed circuit board, where the electric circuit device is provided in the compartment inside the enclosure and where the electrical connector is provided through the opening of the enclosure;
- a sealing device;

characterized in that:
- a first sealing area is provided between a first connection area of the first enclosure section and a first connection area of the second enclosure section;
- a second sealing area is provided between a second connection area of the first enclosure section and a first connection area of the electrical connector;
- a third sealing area is provided between a second connection area of the second enclosure section and a second connection area of the electrical connector;

where the sealing device comprises one, continuous gasket comprising:
- a first gasket section configured to seal the first sealing area;
- a second gasket section configured to seal the second sealing area;
- a third gasket section configured to seal the third sealing area.

In one aspect, the electronic enclosure device according to claim 1, where the first gasket section and the second gasket section provides a continuous first gasket loop and where the third gasket section and the second gasket section provides a continuous second gasket loop.

In one aspect, the first gasket loop is provided in a first plane and where the second gasket loop is provided in a second plane; and where the first plane is provided in an angle with respect to the second plane.

In one aspect, the plane of the first gasket loop is perpendicular to the plane of the second gasket loop.

In one aspect, the second and third gasket sections form a gasket body comprising at least one opening for the connector.

In one aspect, the electrical connector is soldered to the printed circuit board.

In one aspect, the gasket comprises a continuous flange.

In one aspect, the gasket comprises lamellas.

In one aspect, the electrical connector is provided as one or more electrical wires connected to the printed circuit board.

In one aspect, the electrical connector is provided as one or more electrical busbars connected to the printed circuit board.

In one aspect, the electrical connector is provided with a connection interface on the outside of the enclosure.

The present invention also relates to a method for assembling an electronic enclosure device, where the method comprises the steps of:
- providing an electric circuit device comprising a printed circuit board, electronic components connected to the printed circuit board and an electrical connector connected to the printed circuit board;

providing an enclosure comprising a first enclosure section and a second enclosure section, where a first sealing area is provided between a first connection area of the first enclosure section and a first connection area of the second enclosure section, where a second sealing area is provided between a second connection area of the first enclosure section and a first connection area of the electrical connector and where a third sealing area is provided between a second connection area of the second enclosure section and a second connection area of the electrical connector;

providing a sealing device comprising one, continuous gasket comprising first, second and third gasket sections;

applying the second and third gasket sections around the electrical connector of the electric circuit device;

inserting the electric circuit device and the gasket into the second enclosure section in one direction, into a position where the second gasket section is sealing the second sealing area;

applying the first enclosure section in the one direction to the second enclosure section, into a position where the third gasket section is sealing the third sealing area and the first gasket section is sealing the first sealing area.

DETAILED DESCRIPTION

Embodiments of the invention will now be described in detail with reference to the enclosed drawings, where:

Figure 4B:
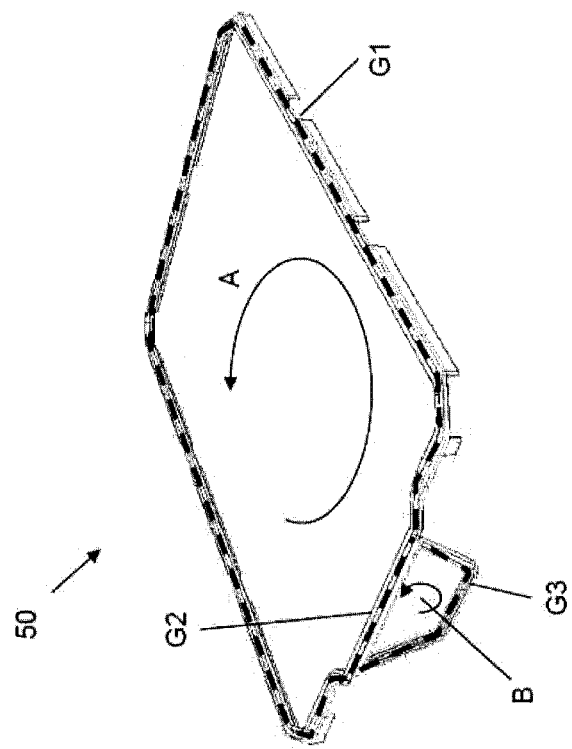
FIG. 4a illustrates a perspective view of the gasket used in the embodiment above.
Figure 4A:
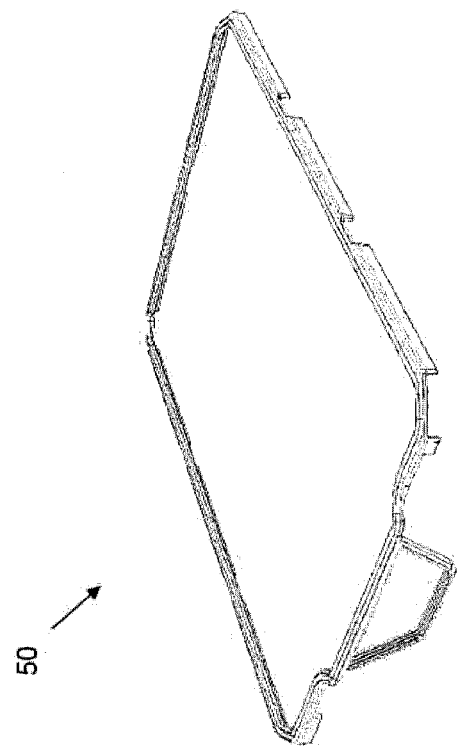

FIG. 4b corresponds to FIG. 4a, with detailed reference numbers.

FIG. 5 illustrates the flange of the gasket.

FIG. 6 illustrates the lamellas of the gasket.

Figure 7:
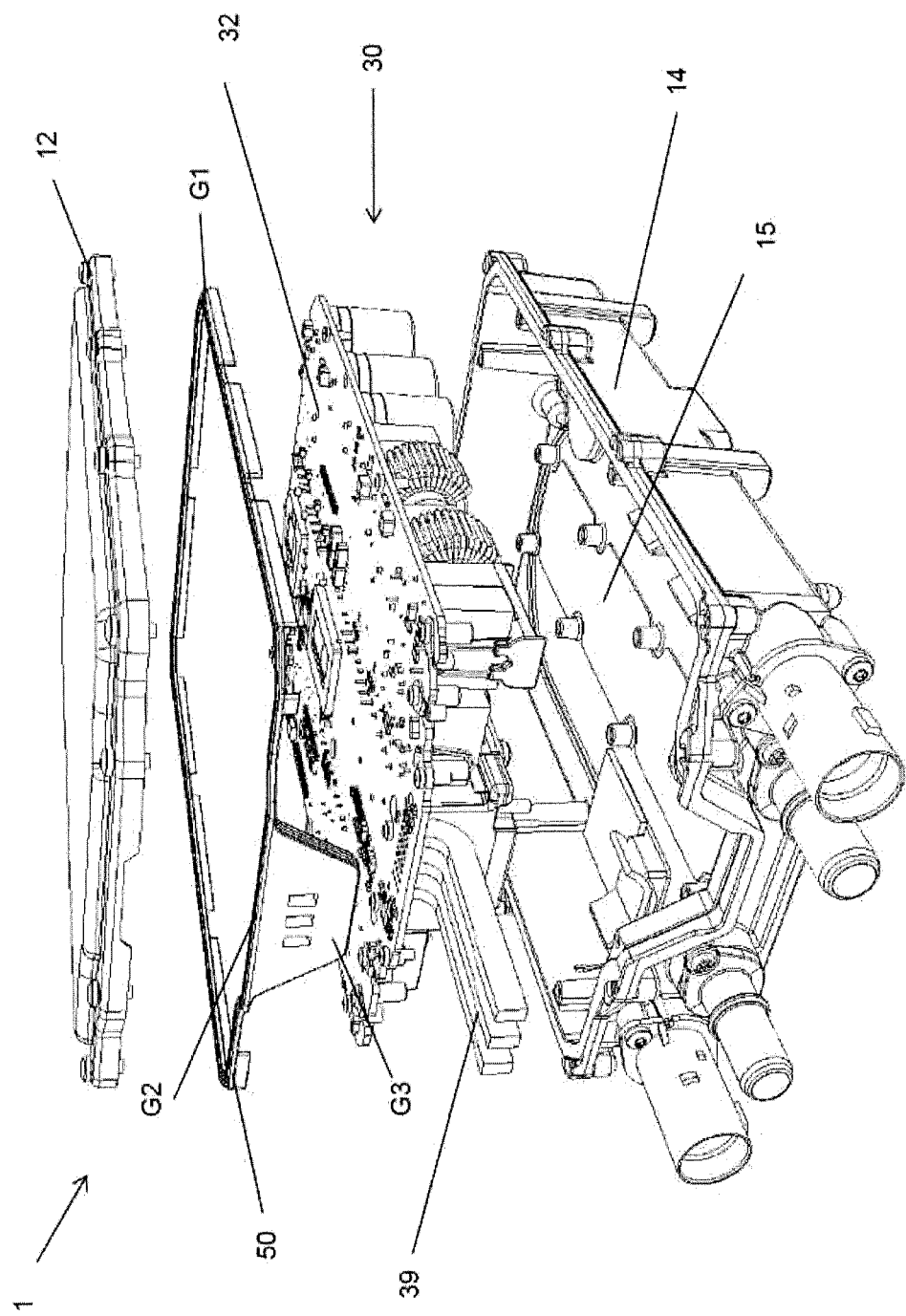

FIG. 7 illustrates a second embodiment of the invention.

Figure 1:
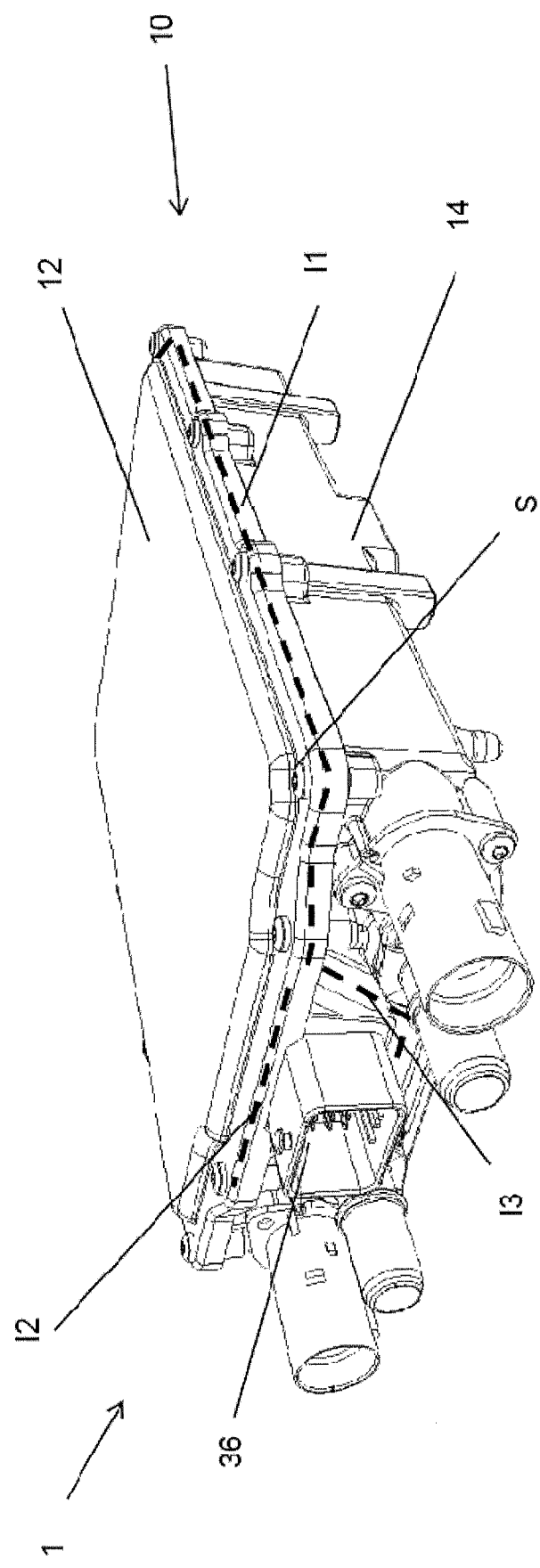
FIG. 1 illustrates a perspective view of a first embodiment of a conductor enclosure in assembled state.
Figure 2:
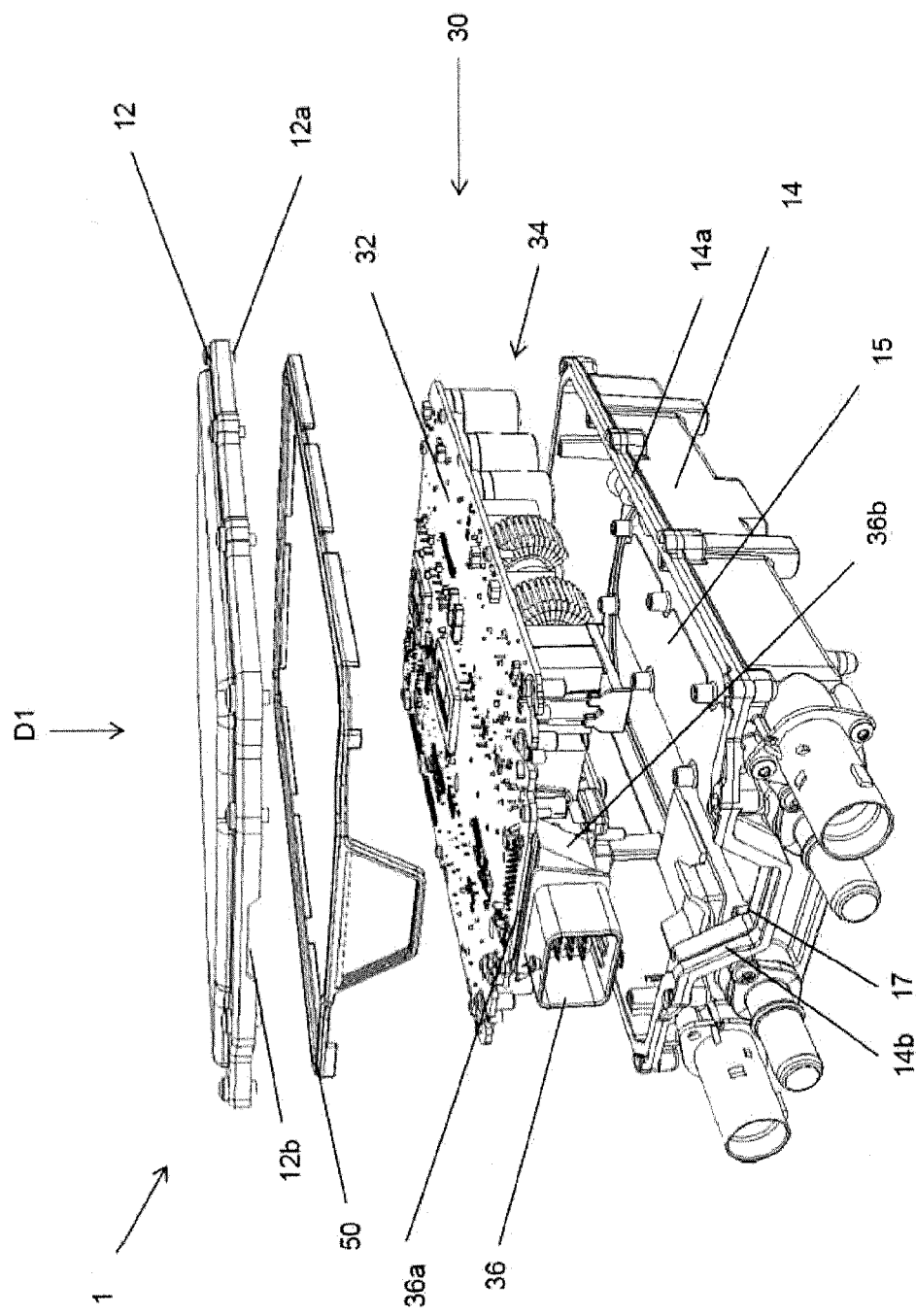
FIG. 2 illustrates an exploded, perspective view of the first embodiment.
Figure 8:
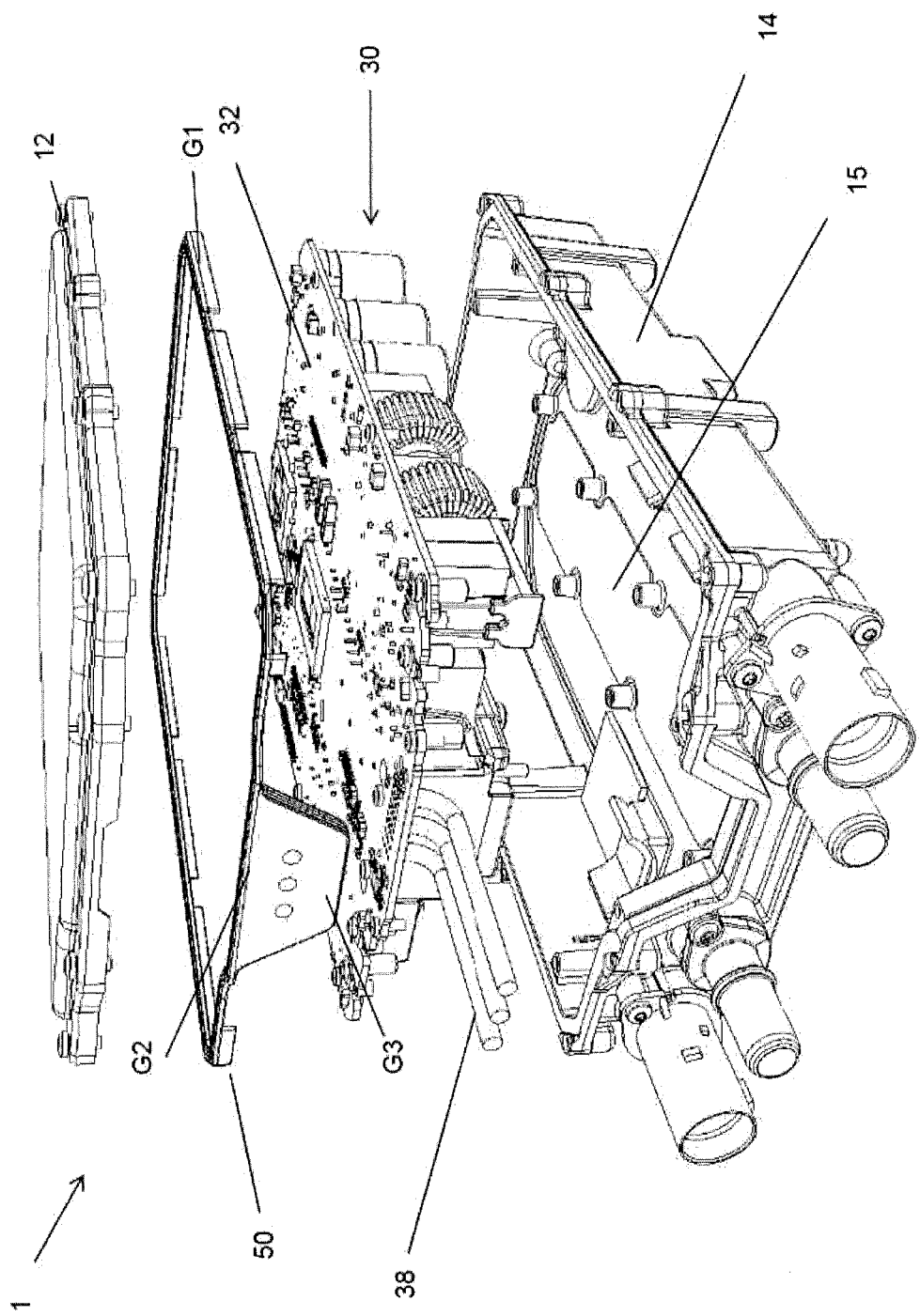

FIG. 8 illustrates a third embodiment of the invention. It is now referred to FIGS. 1 and 2, illustrating a first embodiment of an electronic enclosure device 1 in an assembled state and a disassembled state respectively.

The device 1 comprises an enclosure 10 comprising a first enclosure section 12 and a second enclosure section 14, where a compartment 15 is provided inside the enclosure 10. Typically, the first enclosure section 12 is a lid section, and the second enclosure section 14 is a compartment section.

An opening 17 is provided in the enclosure 10 into the compartment 15. As seen in FIG. 2, the opening 17 is formed as a notch in the second enclosure section 12. In FIG. 2, the notch is substantially U- or V-shaped.

The device 1 further comprises an electric circuit device 30 comprising a printed circuit board 32. Electronic components 34 are connected to the printed circuit board 32. An electrical connector 36 is also connected to the printed circuit board 32. The electrical connector 36 here comprises a rigid structure made of electrically insulated material, typically a plastic material, with a connection interface to other electrical equipment. The connector 36 also comprises one or several pins or other types of electrical conductors for transferring electrical power and/or electrical signals.

The electrical connector 36 is adapted to fit in the notch in the second enclosure section 12. Hence, as shown in FIG. 2, the electrical conductor is substantially U- or V-shaped.

The electric circuit device 30 is provided in the compartment 15 inside the enclosure 10 in the assembled state and the electrical connector 36 is provided through the opening 17 of the enclosure 10, as shown in FIG. 1. Hence, it is possible to connect other types of electrical equipment to the electric circuit device 30 via the connector 36.

The enclosure device 1 is sealed by means of a sealing device in certain sealing areas which will be explained below with reference to FIG. 3.

A first sealing area I1 is provided between a first connection area 12a of the first enclosure section 12 and a first connection area 14a of the second enclosure section 14. The first sealing area I1 is hence considered as the area where the first and second enclosure sections 12, 14 will be in contact with each other when no sealing device is present.

A second sealing area I2 is provided between a second connection area 12b of the first enclosure section 12 and a first connection area 36a of the electrical connector 36. Hence, the second sealing area I2 is considered as the area where the first enclosure section 12 and the electrical connector 36 will be in contact with each other when no sealing device is present.

A third sealing area I3 is provided between a second connection area 14b of the second enclosure section 14 and a second connection area 36b of the electrical connector 36. Hence, the third sealing area I3 is considered as the area where the second enclosure section 14 and the electrical connector 36 will be in contact with each other when no sealing device is present. The third sealing area I3 will be the area between the connector 36 and the notch in the second enclosure section 14.

It is now referred to FIGS. 4a and 4b, where the sealing device is shown. Here, the sealing device comprises one, continuous gasket 50. The gasket 50 comprises a first gasket section G1 configured to seal the first sealing area I1, a second gasket section G2 configured to seal the second sealing area G1, and a third gasket section G3 configured to seal the third sealing area I3.

In FIGS. 4a and 4b it is shown that the first gasket section G1 and the second gasket section G2 provides a continuous first gasket loop A. Moreover, it is shown that the third gasket section G3 and the second gasket section G2 provide a continuous second gasket loop B, as indicated with arrows. Hence, the second gasket section G2 is common for both loops A and B.

Moreover, FIGS. 4a and 4b shows that the first gasket loop A is provided in a first plane and where the second gasket loop B is provided in a second plane; and where the first plane is provided in an angle with respect to the second plane. In FIG. 4b, it is shown that the plane of the first gasket loop A is perpendicular to the plane of the second gasket loop B.

It is now referred to FIG. 5, where it is shown that the gasket comprises a continuous flange 51 in the form of a bending area. The flange 50 improves the sealing properties of the gasket.

It is now referred to FIG. 6, where it is shown that the gasket 50 comprises lamellas 52a, 52 in order to improve its sealing properties.

The gasket 50 may be made of a flexible and water resistant material, such as NBR (nitrile), MVQ (silicon), EPDM (ethylene propylene) or natural rubber material.

It is now referred to FIGS. 7 and 8. Here, the second and third gasket sections G2, G3 form a gasket body comprising at least one opening for the connector 36. Here, the gasket body is adapted to the notch in the second enclosure section 12. The at least one opening may be adapted to the one or several wires, or one or more electrical busbars or other types of electrical connectors. In particular, the at least one opening may be adapted in a water proof manner.

In FIG. 7 it is shown that the gasket body has three circular openings. In FIG. 7, the electrical connector 36 is provided as three electrical busbars 39 connected to the printed circuit board 32. Each of the busbars is inserted through the respective openings in the gasket body during assembly.

In FIG. 8 it is shown that the gasket body has three rectangular openings. In FIG. 8, the electrical connector 36 is provided as three electrical wires 38 connected to the printed circuit board 32. Each of the wires is inserted through the respective openings in the gasket body during assembly. A method for assembling the electronic enclosure device 1 will now be described.

Figure 3:
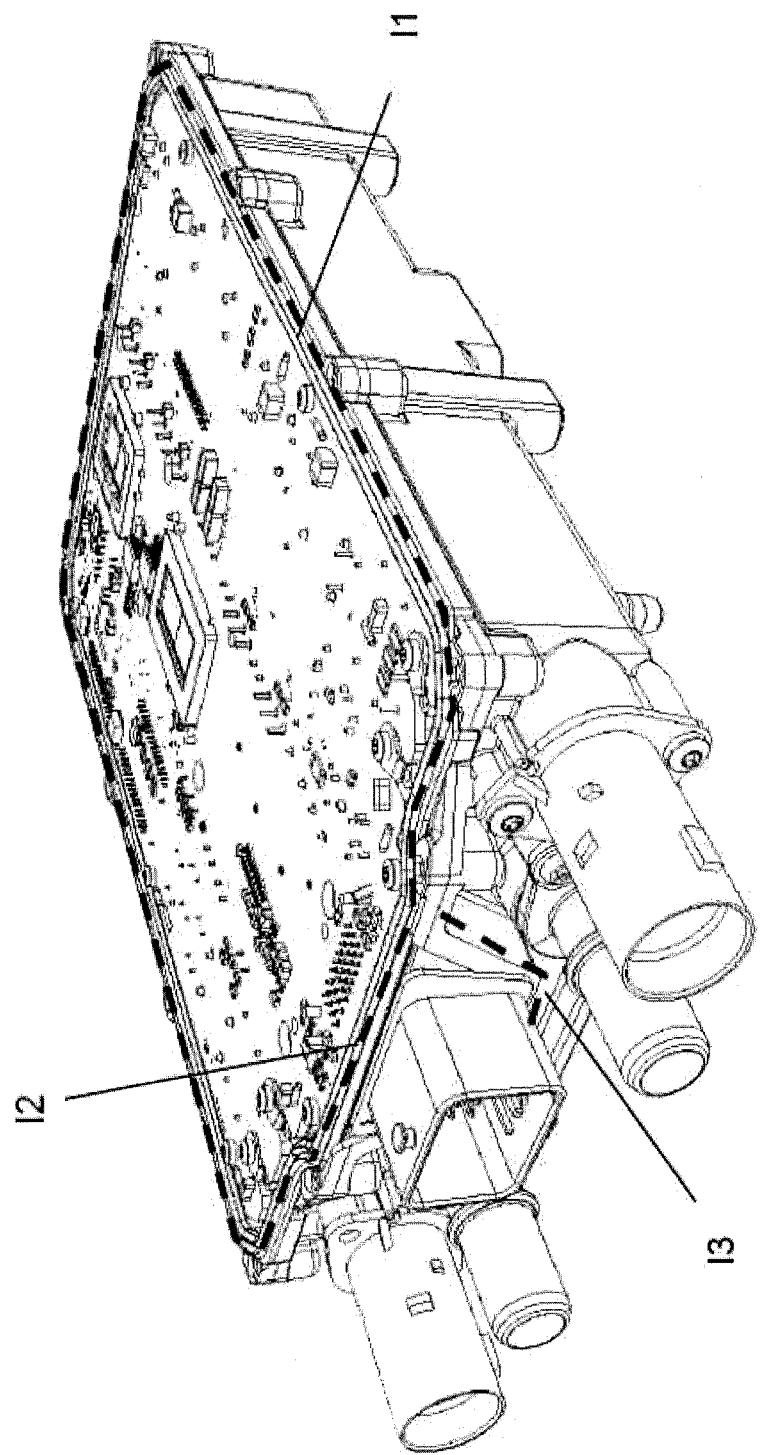
FIG. 3 illustrates a perspective view of the first embodiment, where the lid section of the conductor enclosure is removed.

First, the enclosure 10 comprising the first enclosure section 12 and the second enclosure section 14 is provided together with the electric circuit device 30 and the gasket 50, as shown in FIGS. 2 and 3. As described above, the one, continuous gasket 50 comprises first, second and third gasket sections G1, G2, G3;

The assembly process is started by applying the second and third gasket sections G2, G3 around the electrical connector 36 of the electric circuit device 30.

Then, the electric circuit device 30 and the gasket 50 is inserted into the second enclosure section 14. The insertion process is performed in one direction indicated by arrow D1 in FIG. 2, into a position where the second gasket section G2 is sealing the second sealing area I2. The direction D1 is perpendicular to the plane of the printed circuit board 32.

Then, the first enclosure section 12 is applied to the second enclosure section 14, into a position where the third gasket section G3 is sealing the third sealing area I3 and the first gasket section G1 is sealing the first sealing area I1. The applying process is performed in the same one direction D1.

The first and second enclosure sections 12, 14 may now be secured to each other by securing devices, for example screws S indicated in FIG. 1. These screws are provided outside of the gasket 50, and hence there are no risk for leakages through screw holes etc.

The above assembly process is simple and it is easy to achieve an automated process.

The invention claimed is:

1. An electronic enclosure device, comprising:
a enclosure comprising a first enclosure section and a second enclosure section, where a compartment is provided inside the enclosure and where an opening is provided in the enclosure into the compartment;
an electric circuit device comprising a printed circuit board, electronic components connected to the printed circuit board and an electrical connector connected to the printed circuit board, where the electric circuit device is provided in the compartment inside the enclosure and where the electrical connector is provided through the opening of the enclosure; and
a sealing device, wherein:
a first sealing area is provided between a first connection area of the first enclosure section and a first connection area of the second enclosure section,
a second sealing area is provided between a second connection area of the first enclosure section and a first connection area of the electrical connector;
a third sealing area is provided between a second connection area of the second enclosure section and a second connection area of the electrical connector;
where the sealing device comprises one, continuous gasket comprising:
a first gasket section configured to seal the first sealing area;
a second gasket section configured to seal the second sealing area;
a third gasket section configured to seal the third sealing area.

2. The electronic enclosure device according to claim 1, where the first gasket section and the second gasket section provides a continuous first gasket loop and where the third gasket section and the second gasket section provides a continuous second gasket loop.

3. The electronic enclosure device according to claim 1, where the first gasket loop is provided in a first plane and where the second gasket loop is provided in a second plane; and where the first plane is provided in an angle with respect to the second plane.

4. The electronic enclosure device according to claim 1, where the plane of the first gasket loop is perpendicular to the plane of the second gasket loop.

5. The electronic enclosure device according to claim 1, where the second and third gasket sections form a gasket body comprising at least one opening for the connector.

6. The electronic enclosure device according to claim 1, where the electrical connector (36) is soldered to the printed circuit board.

7. The electronic enclosure device according to claim 1, where the gasket comprises a continuous flange.

8. The electronic enclosure device according to claim 1, where the gasket comprises lamellas.

9. The electronic enclosure device according to claim 1, where the electrical connector is provided as one or more electrical wires connected to the printed circuit board.

10. The electronic enclosure device according to claim 1, where the electrical connector is provided as one or more electrical busbars connected to the printed circuit board.

11. The electronic enclosure device according to claim 1, where the electrical connector is provided with a connection interface on the outside of the enclosure.

12. A method for assembling an electronic enclosure device, comprising:
providing an electric circuit device comprising a printed circuit board, electronic components connected to the printed circuit board and an electrical connector connected to the printed circuit board;
providing an enclosure comprising a first enclosure section and a second enclosure section, where a first sealing area is provided between a first connection area of the first enclosure section and a first connection area of the second enclosure section, where a second sealing area is provided between a second connection area of the first enclosure section and a first connection area of the electrical connector and where a third sealing area is provided between a second connection area of the second enclosure section and a second connection area of the electrical connector;
providing a sealing device comprising one, continuous gasket comprising first, second and third gasket sections;
applying the second and third gasket sections around the electrical connector of the electric circuit device;

inserting the electric circuit device and the gasket into the second enclosure section in one direction, into a position where the second gasket section is sealing the second sealing area; and applying the first enclosure section in the one direction to the second enclosure section, into a position where the third gasket section is sealing the third sealing area and the first gasket section is sealing the first sealing area.

* * * * *